(12) United States Patent
Dashtestani et al.

(10) Patent No.: US 7,345,542 B2
(45) Date of Patent: *Mar. 18, 2008

(54) CIRCUIT AND METHOD FOR AVOIDING CIRCUIT PERFORMANCE DEGRADATION CAUSED BY TIME-VARIABLE THERMAL IMBALANCES

(75) Inventors: Ahmad Dashtestani, Tucson, AZ (US); Joel M. Halbert, Tucson, AZ (US)

(73) Assignee: Texas Instruments Incorporated, Dallas, TX (US)

( * ) Notice: Subject to any disclaimer, the term of this patent is extended or adjusted under 35 U.S.C. 154(b) by 56 days.

This patent is subject to a terminal disclaimer.

(21) Appl. No.: 11/311,735

(22) Filed: Dec. 19, 2005

(65) Prior Publication Data

US 2006/0152283 A1    Jul. 13, 2006

Related U.S. Application Data

(63) Continuation-in-part of application No. 11/032,254, filed on Jan. 10, 2005.

(51) Int. Cl.
*H03F 3/45* (2006.01)

(52) U.S. Cl. ....................... 330/256; 330/289

(58) Field of Classification Search ........... 330/256, 330/289, 298, 260, 207 P
See application file for complete search history.

(56) References Cited

U.S. PATENT DOCUMENTS

| | | | |
|---|---|---|---|
| 4,528,516 A | * | 7/1985 | Hill, III .................... 330/254 |
| 5,247,210 A | | 9/1993 | Swanson ................... 307/355 |
| 6,317,001 B1 | * | 11/2001 | Roth ........................ 330/289 |
| 6,967,526 B1 | * | 11/2005 | Churchill ..................... 330/9 |

\* cited by examiner

*Primary Examiner*—Henry Choe
(74) *Attorney, Agent, or Firm*—Wade J. Brady, III; Frederick J. Telecky Jr.

(57) ABSTRACT

A signal processing circuit includes a circuit stage for operating on signals in a signal path of an input signal, including main circuitry for operating on relatively small-value signals and alternative circuitry for amplifying/processing signals during a condition which otherwise would cause thermal imbalance in the main circuitry. The circuit stage includes switching circuitry for coupling signals in the signal path of the input signal to the main input circuitry during normal small-signal operating conditions and for coupling signals in the signal path of the input signal to the alternative circuitry during the condition which otherwise would cause thermal imbalance in the main circuitry.

20 Claims, 7 Drawing Sheets

CIRCUIT AND METHOD FOR AVOIDING CIRCUIT PERFORMANCE DEGRADATION CAUSED BY TIME-VARIABLE THERMAL IMBALANCES

CROSS REFERENCE TO RELATED APPLICATION

This application is a continuation-in-part of the commonly assigned patent application entitled "DIFFERENTIAL AMPLIFIER CIRCUIT AND METHOD FOR REDUCING THERMALLY INDUCED OFFSETS CAUSED BY LARGE DIFFERENTIAL SIGNALS", Ser. No. 11/032,254, filed on Jan. 10, 2005 by the present inventors, and incorporated herein by reference.

BACKGROUND OF THE INVENTION

The present invention relates generally to problems associated with differential thermal effects caused by power imbalances in integrated circuit chips, and particularly to circuits and techniques for reducing the time required for recovery from such differential thermal effects.

It is well known that certain transient or steady-state large-signal input conditions can cause circuit operation that creates large power imbalances within an integrated circuit. In some cases, the integrated circuit must be operated so as to allow it sufficient time to "recover" from the large power imbalances before proper circuit operation can continue. The power imbalances can cause a temporary temperature imbalance between different regions of the integrated circuit that substantially changes the operating characteristics of circuit components, such as transistors, located in the regions of the temperature imbalance. This may result in unacceptably inaccurate circuit performance until sufficient "recovery time" has elapsed to allow the temperature to be balanced between the regions.

Various other conditions are known to cause similar imbalanced thermal conditions in integrated circuit chips. For example, large-signal slewing conditions or transient imbalances may cause recovery settling "tails" in the output response of a circuit. Input signal overdrive conditions beyond the linear range of an amplifier and its feedback loop may result in thermal imbalance conditions of long duration. Also, various special-purpose applications that may cause linear feedback in an amplifier circuit to be interrupted or limited (e.g. sample/hold amplifiers, peak detector circuits, and limiting/clamping amplifiers) can cause thermal imbalance conditions of the kind referred to above in an integrated circuit. Although a thermal imbalance condition can occur due to simple transient slewing, it may be most problematic in applications in which a feedback loop is interrupted for a relatively long interval, for example in a sample/hold amplifier, a peak detector circuit, a limiting or clamping amplifier, or a multiplexed amplifier. In some cases the effects of such thermal imbalance can be reduced.

However, in the case of non-feedback integrated circuits such as voltage comparators, the duration and magnitude of thermal imbalance ordinarily would not be reduced and are dependent only on the characteristics of the differential input signal of the comparators. For example, a comparator in an ADC (analog to digital converter) usually remains or "dwells" in a highly unbalanced state most of the time and it is necessary, at a point near the end of a particular step of the ADC conversion process, that the comparator not be still undergoing a thermal recovery from the previous step of the conversion process because the error due to ongoing thermal recovery could exceed the magnitude of the comparator input signal to be discriminated. Of course, this could result in inaccurate bit decisions. U.S. Pat. No. 5,247,210 entitled "Method and Circuitry for Decreasing the Recovery Time of an MOS Differential Voltage Comparator" issued Sep. 21, 1993 to Swanson describes a technique for decreasing the recovery time on an MOS differential voltage comparator, but does not address thermal mismatch issues.

Figure 1:
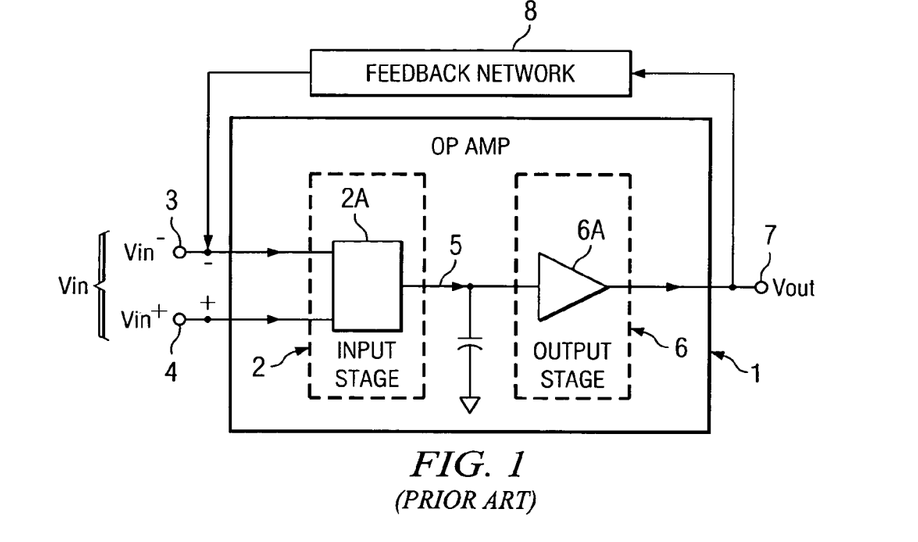
FIG. 1 is a block diagram of a conventional feedback amplifier.

FIG. 1 shows a conventional closed loop feedback network that includes an operational amplifier 1 which receives a differential input signal Vin applied between a (−) input conductor 3 and a (+) input conductor 4. The input conductors 3 and 4 are connected to the inputs of a differential input transistor pair in circuitry 2A of an input stage 2 of amplifier 1. Input stage 2 also may include either additional components which convert a differential input current from the input transistor pair into a voltage signal provided to a subsequent stage, or alternatively may include a folded cascode circuit, the output of which drives the high impedance compensation node 5 (i.e., "comp node" 5 of folded cascode stage 2A). Comp node 5 is connected to the input of a conventional output driver circuit 6A of an output stage 6. Output driver circuit 6A produces an output signal Vout on conductor 7, which is connected to the input of a feedback network 8 (which often is simply a feedback resistor). The output of feedback network 8 is connected to inverting input 3.

Figure 2A:
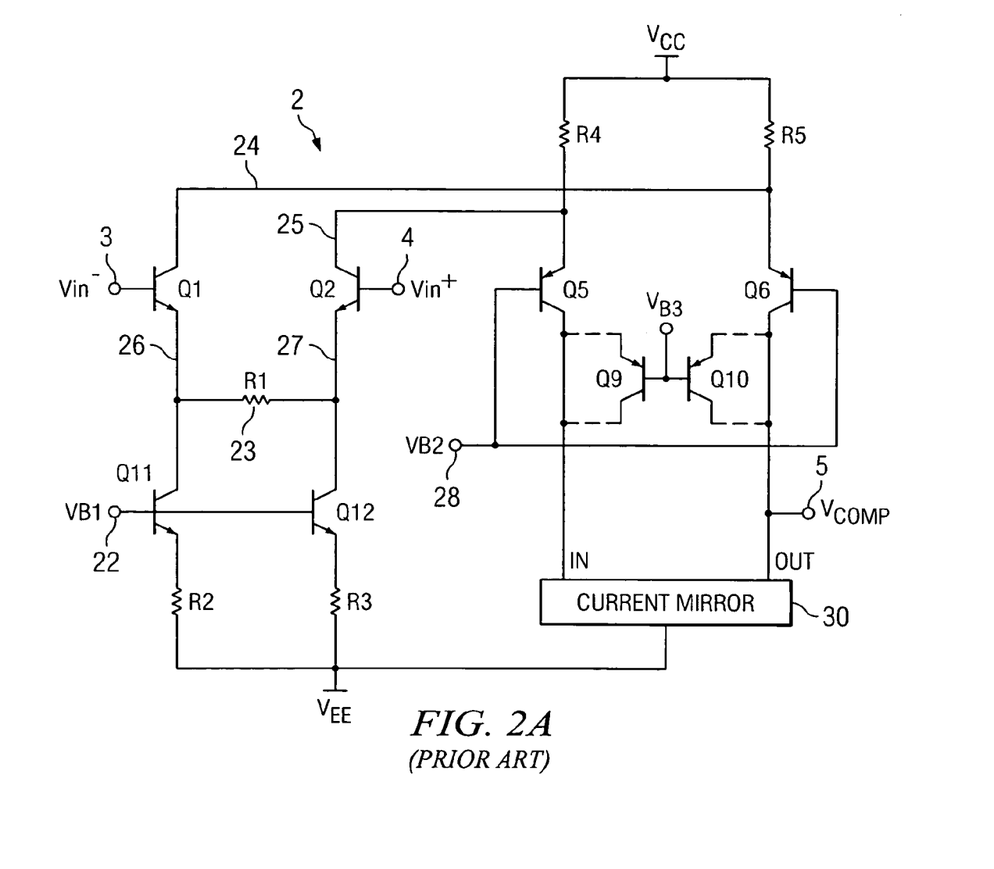
FIG. 2A is a schematic diagram of a folded cascode input stage of the feedback amplifier of FIG. 1.

FIG. 2A shows a schematic diagram of a conventional differential input circuit and folded cascode stage which can be used as input stage 2 of FIG. 1. Referring to FIG. 2A, Vin− is applied to the base of an NPN input transistor Q1, and Vin+ is applied to the base of an NPN input transistor Q2, the emitter of which is coupled by conductor 27 to the collector of an NPN current source transistor Q12. The emitter of transistor Q12 is coupled by a resistor R3 to a power supply voltage VEE. The emitter of input transistor Q1 is connected by conductor 26 to the collector of a current source transistor Q11, the emitter of which is coupled by a resistor R2 to VEE. A resistor R1 is connected between conductors 26 and 27. The bases of current source transistors Q11 and Q12 are connected to a bias voltage VB1 on conductor 22. The collector of input transistor Q1 is coupled by a conductor 24 to the emitter of a folded cascode PNP transistor Q6 and to one terminal of a resistor R5 coupled between conductor 24 and a power supply voltage VCC. Similarly, the collector of input transistor Q2 is coupled by a conductor 25 to the emitter of a folded cascode PNP transistor Q5 and to one terminal of a resistor R4 coupled between conductor 24 and VCC. The bases of cascode transistors Q5 and Q6 are connected to a bias voltage VB2 by conductor 28. Typically, the high impedance compensation or "comp" node of the entire circuit 2 is the collector of transistor Q6. In FIG. 2A, the collector of transistor Q5 is coupled to an input of a current mirror 30. The collector of transistor Q6 is connected by conductor 5 to an output of current mirror 30. The voltage on comp node conductor 5 is labeled Vcomp. If desired, a technique referred to as "re-cascoding" can be used wherein the collector of transistor Q5 is connected to the emitter of a PNP cascode transistor Q9, the collector of which is connected to current mirror 30, as shown in dashed lines. The collector of transistor Q6 is connected to the emitter of a PNP cascode transistor Q10, the collector of which is connected to another terminal of current mirror 30, as shown in dashed lines. The bases of cascode transistors Q9 and Q10, if provided, are connected to a suitable bias voltage VB3.

In the conventional closed loop feedback network of FIG. 1, the differential input error voltage is forced by the feedback loop to be nearly zero. Therefore, input stage 2 is driven to a balanced condition. Typical symmetrical construction of such circuitry on the integrated circuit chip and, along with the balanced operating condition due to the nearly-zero error voltage value of Vin, results in a thermally balanced condition of each of the power-dissipating circuit elements with respect to corresponding balanced components on the other side of the symmetrical construction.

However, if the differential input voltage Vin between the bases of transistors Q1 and Q2 is excessively large, then one of transistors Q1 and Q2 either carries no current or much less current than the other, and therefore temporarily dissipates a much different amount of power than the normal amount of power, therefore increasing the temperature difference between regions in transistors Q1 and Q2, respectively. Computer analysis and laboratory measurements have shown that the increased temperature can result in significant thermally-induced offset voltages associated with transistors Q1, Q2, Q5 and Q6. The effect of this on the recovery time of output voltage Vout (FIG. 1) appears in the waveform "A" shown in FIG. 6.

For example, if Vin+ is much larger than Vin−, then input transistor Q1 is turned off and dissipates no power. Meanwhile, a large current flows through input transistor Q2, causing it to dissipate a large amount of power. This results in substantially higher temperature in the emitter-base junction of input transistor Q2 than in input transistor Q 1, which can substantially change the operating characteristic of transistor Q2 relative to transistor Q1. After the above described Vin input overdrive condition ends, the feedback loop causes the error voltage Vin=Vin+−Vin− to be essentially zero so the feedback loop is properly balanced, and an amount of time, referred to as the "thermal recovery time" or "thermal tail", is required for input transistors Q1 and Q2 to thermally recover to substantially the same temperature so the thermally sensitive circuitry including transistors Q1 and Q2 is balanced and the thermally-induced input offset voltage settles to a negligible value. Only then can a reliable precise value of Vout be obtained from the feedback amplifier. However, the thermal recovery time or "tail" shown in waveform "A" of FIG. 6 may be unacceptably long. Furthermore, during the Vin overdrive condition the same current flowing through transistor Q2 is subtracted from the current flowing through cascode transistor Q5, which reduces the power dissipation in transistor Q5. This causes a thermal imbalance between cascode transistors Q5 and Q6.

It should be appreciated that in a comparator there is no feedback mechanism to drive the input transistors back to a balanced condition with equal input voltages. Therefore, after a comparator decision process, the comparator remains in unbalanced condition until the next comparator decision is made. If the comparator inputs are nearly equal, there is a risk of the comparator making a wrong decision because of the input offset error caused by the thermal imbalance between the comparator input transistors.

Various techniques have been used for providing symmetrical circuit architectures and corresponding integrated circuit topography layouts to achieve thermal balance in integrated circuits, in recognition of the fact that thermal imbalance can cause lack of precision in circuit operation. That is, integrated circuit layout symmetry generally is associated with precision of circuit operation. It is a widely accepted practice that in integrated circuits for analog signal processing it is necessary to have well balanced circuit architectures and topography layouts which are generally symmetrical about various "centerlines" of the integrated circuit chip. Good analog integrated circuit design practice recognizes that this is necessary to achieve precision DC circuit operation and stability, predictable signal settling times, and reduced signal distortion. (While this is generally true in voltage feedback operational amplifiers, it is somewhat less true in current feedback operational amplifiers, due to high-impedance inputs and low-impedance output of the input stage of a current feedback operational amplifier.)

As an example, symmetry of architecture and the corresponding integrated circuit layout topography is needed for precision of DC circuit operation when a differential circuit is in an "idle" condition wherein the differential input signal is zero. The symmetry of circuit architecture and of layout topography also is needed when the circuit is "modulated" from the idle condition by an input signal in order to achieve low signal distortion, fast, clean signal settling, and low thermal "hysteresis" or "thermal history" when the modulating input signal returns to a low value. (The term "thermal hysteresis" or "thermal history" may refer to the way a transition such as a switching point voltage or "trip point" of a differential input stage is changed by the existing state of the differential input stage, for example so that the differential input signal has to increase beyond the normal trip point voltage to ensure that the differential input stage properly switches, or to ensure that the differential circuit does not switch too soon at a voltage less than the normal trip point voltage.)

It should be appreciated that the thermal time constants of recovery due to thermal imbalances in the integrated circuit chip are much longer than the electrical time constants of the signal/conditions which actually cause the thermal imbalances. The long thermal time constants therefore can be thought of as representing or causing secondary electrical signal paths having different electrical characteristics and longer recovery time constants than the primary electrical signal paths that exist when there is no thermal imbalance. Consequently, the transfer characteristic of an integrated circuit does not recover from a thermally imbalanced condition of the integrated circuit chip to its original configuration until amounts of time equal to the thermal time constants have elapsed after the modulating signal has returned to the low value.

The thermal imbalance effects mentioned above often are caused by "third-order" device topography features that are not easily modeled for circuit simulation purposes. The applicants are unaware of any available circuit simulation tools that accurately model the effects of thermal imbalances in typical integrated circuit layout arrangements.

It should be appreciated that problems caused by the thermal imbalances resulting from "self-heating" due to signal imbalances or offset voltages can be several orders of magnitude greater for SOI (silicon on insulator) integrated circuits than for junction-isolated integrated circuits because in SOI structures each circuit element is bounded by an oxide insulator which has a very large thermal resistance, and hence a very large corresponding thermal time constant.

A important type of thermal imbalance in integrated circuits is caused by differential thermal self-heating in the locations of the differentially coupled input transistors of amplifiers and comparators as a result of differential currents which flow through the input transistors as a result of differential input signals applied to differentially coupled input transistors and/or as a result of input offset voltages associated with the differentially coupled input transistors.

Various techniques have been used to partially overcome problems associated with differential mismatching between devices such as differentially coupled input transistors of an integrated circuit amplifier or comparator. One technique for dealing with an input offset voltage is to cascode the collectors or drains of the mismatched input transistor pair. This effectively reduces the magnitudes of the differential static and dynamic voltages across the mismatched input transistors and shifts a substantial amount of the differential power dissipation from locations of the input transistors to the cascode transistors. In some cases the offset voltage associated with the cascode transistors may contribute as much or more to the input-referred offset voltage of the integrated circuit as the mismatch between the base-emitter turn-on voltages of the input transistors.

Differential self-heating in the cascode transistors can affect other electrical parameters (such as transistor current gain) more than the offset voltage between them, and can cause offset errors to be "referred" back to the input of the amplifier circuit. (There are several known cascoding techniques, including (1) applying fixed bias voltage on the base or gate electrodes of cascode transistors, (2) providing "floating" cascode transistors in which the bias voltage applied to the base or gate electrodes of the cascode transistors is referenced to the emitter or source electrodes of the mismatched input transistors being cascoded to maintain low fixed voltages across them, (3) providing folded cascode circuitry, and (4) providing floating folded cascode circuitry.) A technique for reducing power in an integrated circuit has been to turn off bias circuitry during certain circuit operating conditions. For example, comparators in some synchronous systems have been temporarily un-biased after their output values have been latched into flip-flops, to reduce power consumption and the effect of associated thermal imbalances in the comparator input transistors.

Figure 2B:
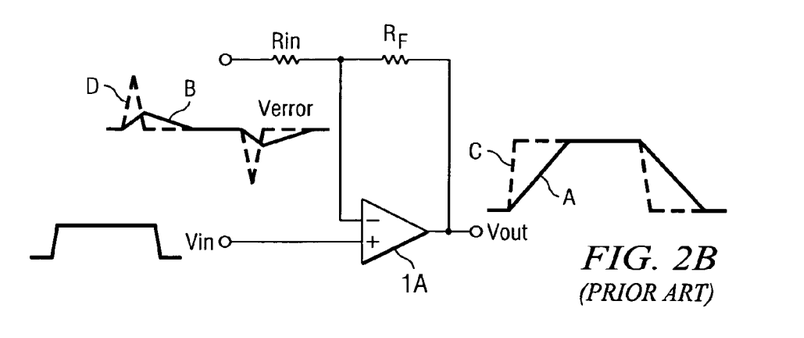
FIG. 2B is a diagram illustrating structure and operation of both slew-limited and non-slew-limited operation of a continuous closed-loop amplifier.

FIG. 2B shows a continuous closed-loop amplifier circuit in which an output of an operational amplifier 1A is connected by a feedback resistor RF to the (−) input thereof. The (−) input also is connected by an input resistor Rin to ground, and the (+) input is connected to receive a square-wave input pulse, as illustrated. If the output Vout is slew-limited, it has the appearance indicated by the solid-line waveform A. The feedback of Vout to the (−) input results in the error signal indicated by the solid-line waveform B between the (−) and (+) inputs, as illustrated. This is the case for typical high-precision integrated circuit operational amplifier designs, and results in an extended imbalance between the (−) and (+) inputs and consequently causes an extended thermal imbalance condition. The slew-limited response of Vout causes the error signal between the (−) and (+) inputs to have the illustrated somewhat sawtooth-like waveform as a result of delay in the slew-limited Vout signal relative to Vin, wherein the amount of the thermal imbalance is generally indicated by the area under the error signal. This causes thermal imbalance in the amplifier input stage to exist for an extended amount of time.

It should be appreciated that those skilled in the art sometimes deal with self-heating problems in a transistor by increasing the transistor size to reduce the maximum temperatures, but in many cases increased transistor size unacceptably reduces circuit speed. Sometimes fixed-current load devices are used and successive differential amplification stages are added to overcome thermal imbalance problems, but at the cost of increased circuit complexity.

In the case where Vout is not slew-limited, then Vout as shown in FIG. 2B has the shape indicated by the dashed-line waveform C, which results in the error signal indicated by the dashed-line waveform D. The error signal may have much higher peaks but be much narrower in this case, and may result from substantially larger currents in the amplifier input stage. However, the integrated energy under the error curve will be about the same both in the slew-limited case and in the non-slew-limited case, relatively independently of the slew rate.

Figure 2C:
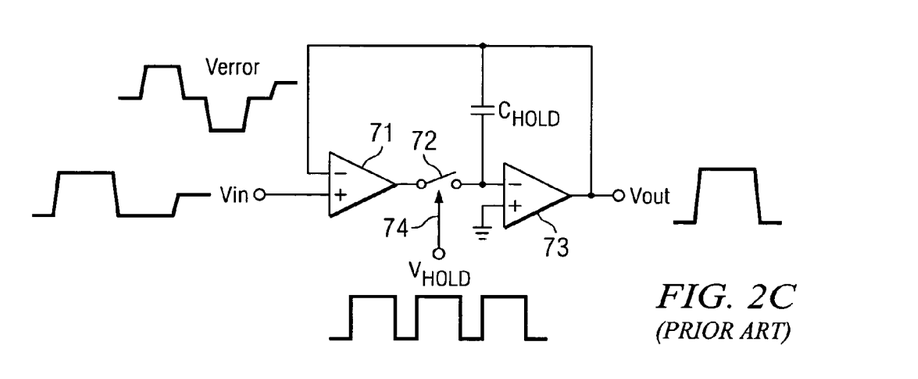
FIG. 2C is a diagram illustrating structure and operation of a conventional sample/hold amplifier.

FIG. 2C shows a conventional sample/hold amplifier 70 which includes a transconductance stage 71, an amplifier stage 73, and a sampling switch circuit 72 connected between the output of transconductance stage 71 and the (−) input of amplifier stage 73. The (+) input of amplifier stage 73 is connected to ground, and its output Vout is fed back to the (−) input of transconductance stage 71 and to one terminal of a holding capacitor CHOLD the other terminal of which is connected to the (−) input of amplifier 73. An input signal Vin is coupled to the (+) input of transconductance stage 71 as illustrated, and sampling switch 72 is controlled by a HOLD signal applied to a control terminal 74 of sampling switch 72, as illustrated. The feedback of the Vout signal resulting from the broken feedback loop when sampling switch 72 is opened results in an error signal as illustrated between the (−) and (+) inputs of transconductance stage 71 which may cause severe thermal imbalance in the integrated circuit chip. This sample/hold amplifier is characterized by an error signal with large deviations and long dwell times, so the integration of power under the error signal is very large.

Figure 2D:
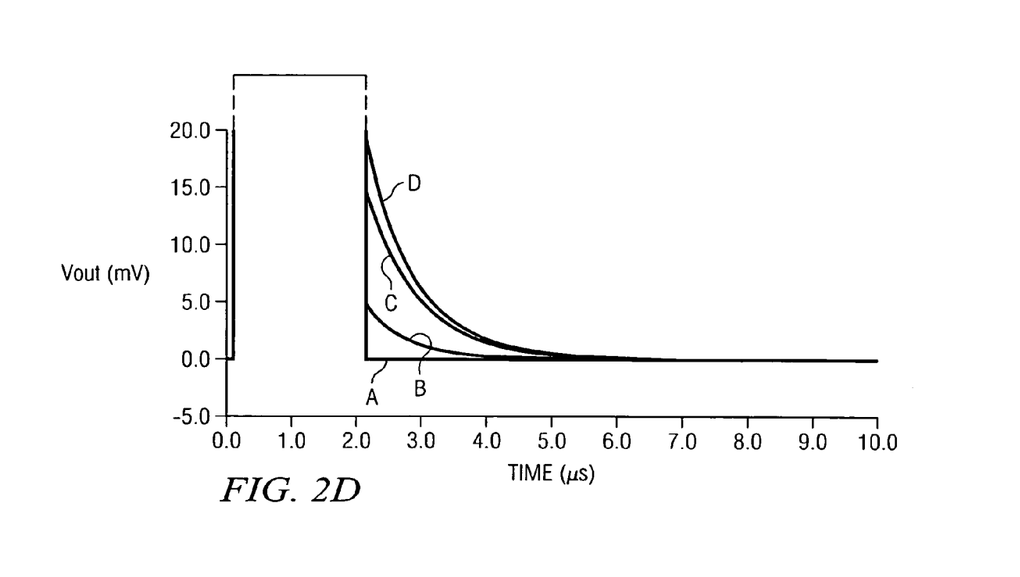
FIG. 2D is a graph illustrating contributions of various sections of the circuitry shown in FIG. 2A to recovery time required for Vout.

The graph of FIG. 2D includes simulated curves that illustrate the contributions of various portions of the circuit shown in prior art FIG. 2A to the recovery time of Vout. Curve A shows that a simulation of Vout is unaffected by thermal imbalance if simulation of self-heating effects are not somehow superimposed on the circuit simulation. Curve B illustrates the recovery of Vout if only the effect of thermal imbalance between the input transistors Q1 and Q1 is simulated (by adjusting appropriate parameters in the transistor circuit model used in the circuit simulation program) in accordance with temperature values used in the thermal simulation model. Similarly, curve C illustrates the recovery of Vout if only the effect of thermal imbalance between the cascode transistors Q5 and Q6 is included in the simulation, and curve D illustrates the recovery of Vout if the effect of thermal imbalances between input transistors Q1 and Q2, load transistors Q11 and Q12, and cascode transistors Q5 and Q6 are included in the simulation of Vout.

Prior techniques are known for switching the amplifier signal path back and forth between separate differential input stages of a single operational amplifier. For example, the assignee's line of SWOP AMP operational amplifiers ("switchable op amps") uses this technique. However, the switching of the differential input stages therein is performed in response to a timed external signal, such as a clock signal or a control signal, and the purpose of the switching function is to implement multiple gains and other signal processing options, and is not for the purpose of affecting thermal performance.

However, the present inventors believe that the magnitude of the thermal imbalances caused by imbalanced signals are offsets are not generally recognized in integrated circuit industry, and that the improvements in circuit performance that might be achievable by overcoming these problems also are not generally recognized in the integrated circuit industry.

In some applications, sampling or under-sampling is performed wherein inaccuracies due to thermal imbalances create signal distortion effects in circuits such as ADCs, digital radios, and the like which are very sensitive to signal distortion and result in frequency spectrum "products" that are difficult to distinguish from the intended signal.

Many amplifiers and precision analog processing circuits and signal processing circuits have a power-down or shutdown mode in which part or all of the circuit goes into a "sleep mode". When the circuit "wakes up", it may need to immediately begin very precise operation despite localized common mode self-heating that may exist and associated delay required for the circuit to recover to an equilibrium state. Such recovery can be unpredictable because when the power is first turned on, the circuit the inputs may be at undetermined levels which may result in thermal imbalance that is substantially worse than during normal operation of the circuit.

There appears to be no previously known practical solution to reducing the above described inaccurate circuit performance due to thermal imbalance caused by self-heating in an integrated circuit.

Thus, there is an unmet need for a circuit and technique for reducing or preventing transient or temporary power imbalances in an integrated circuit which cause transient inaccuracies in an output signal produced by the integrated circuit.

There also is an unmet need for a circuit and technique for reducing or preventing a transient or temporary power imbalance in a particular region of an integrated circuit which cause a thermal tail of a signal produced in the integrated circuit.

There also is an unmet need for a circuit and technique for reducing or preventing inaccurate switching due to a time-variable input offset caused by a transient or temporary power imbalance in a particular region of a comparator.

There also is an unmet need for a circuit and technique for reducing or preventing inaccurate operation of an analog-to-digital converter due to a transient or temporary power imbalance in a particular region of one or more comparators in the analog-to-digital converter.

There also is an unmet need for a circuit and technique for reducing or preventing undesirable effects of a transient or temporary power imbalance in a particular region of an integrated circuit due to an excessively large input signal.

There also is an unmet need for a circuit and technique for avoiding inaccuracy in analog signal sampling circuits due to transient thermal imbalances in the integrated circuit.

There also is an unmet need for a circuit and technique for providing fast recovery from power down or shutdown states in an integrated circuit.

SUMMARY OF THE INVENTION

It is an object of the invention to provide a circuit and technique for reducing or preventing transient or temporary power imbalances in an integrated circuit which cause transient inaccuracies in an output signal produced by the integrated circuit.

It is an object of the invention to provide a circuit and technique for reducing or preventing a transient or temporary power imbalance in a particular region of an integrated circuit which causes a "thermal tail" of a signal produced in the integrated circuit.

It is an object of the invention to provide a circuit and technique for reducing or preventing inaccurate switching due to a time-variable input offset caused by a transient or temporary power imbalance in a particular region of an integrated circuit.

It is an object of the invention to provide a circuit and technique for reducing or preventing inaccurate switching due to a time-variable input offset caused by a transient or temporary power imbalance in a particular region of an integrated circuit due to an interruption in a feedback loop in the integrated circuit.

It is another object of the invention to provide a simple circuit and method for producing a control signal that indicates whether the value of an input signal is within a predetermined range.

It is another object of the invention to provide a simple circuit and method for producing a control signal that indicates whether the value of an input signal is within a predetermined range in response to the input signal itself.

It is another object of the invention to provide a circuit and technique for reducing or preventing inaccurate switching of a comparator in an integrated circuit due to inaccurate switching due to a time-variable input offset caused by a transient or temporary power imbalance in a particular part of the comparator.

It is another object of the invention to provide a circuit and technique for reducing or preventing inaccurate operation of an analog-to-digital converter due to inaccurate switching due to a time-variable input offset caused by a transient or temporary power imbalance in a particular part of one or more comparators in the analog-to-digital converter.

It is another object of the invention to provide a technique for avoiding or reducing inaccurate switching due to a time-variable input offset caused by effects of thermal hysteresis or thermal history in an integrated circuit.

It is another object of the invention to avoid inaccuracy in analog signal sampling circuits due to transient thermal imbalances in the integrated circuit.

It is another object of the invention to provide fast recovery from power down or shutdown states in integrated circuits.

Briefly described, and in accordance with one embodiment, the present invention provides signal processing circuitry including a first circuit stage (200A) for operating on signals in a signal path of an input signal. The first circuit stage (200A) includes main circuitry (Q1,Q2) for operating on relatively small-value signals in the signal path of the input signal, the first circuit stage (200A) also including alternative circuitry (Q3,Q4) for processing signals in the signal path of the input signal during a condition which otherwise would cause thermal imbalance in the main circuitry (Q1,Q2). The first circuit stage (200A) includes switching circuitry (Q11,Q12,Q13,Q14) for coupling signals in the signal path of the input signal to the main input circuitry (Q1,Q2) during normal small-signal operating conditions and for coupling signals in the signal path of the input signal to the alternative circuitry (Q3,Q4) during the condition which otherwise would cause thermal imbalance in the main circuitry (Q1,Q2). The switching circuitry (Q11, Q12,Q13,Q14) operates in response to a condition detection circuit (60) for detecting the condition or decoding information which indicates the presence of the condition. In one embodiment, the condition detection circuit (60) operates in response to the input signal (Vin) to detect the condition by detecting whether a magnitude of the input signal (Vin) exceeds a predetermined value. In another embodiment, the condition detection circuit (60) operates to detect the condition by detecting or decoding a predetermined state of a system coupled to the signal processing circuitry to indicate the presence of the condition. In the described embodiments, the input signal is a differential input signal. The first circuit stage (200A) can be an input stage of an operational amplifier. The first stage also could be a folded cascode stage (200B) of an operational amplifier. The signal processing circuitry could be an operational amplifier which includes a differential input stage and a folded cascode stage (200B) which includes main circuitry (Q5,Q6) coupled to an output port (32,33) of the input stage (200A) for operating on relatively small-value signals in the signal path of the input signal, wherein the folded cascode stage (200B) also includes alternative circuitry (Q7,Q8) coupled to the output port (32,33) for amplifying signals in the signal path of the input signal during a condition which otherwise would cause thermal imbalance in the main circuitry (Q7,Q8) of the folded cascode stage (200B). The folded-cascode stage also includes switching circuitry (Q15,Q16) for coupling signals in the signal path of the input signal to the main input circuitry (Q5,Q6) of the folded cascode stage (200B) during normal small-signal operating conditions and for coupling signals in the signal path of the input signal to the alternative circuitry (Q7,Q8) of the folded cascode stage (200B) during the condition which otherwise would cause thermal imbalance in the main circuitry (Q5,Q6) of the folded cascode stage (200B).

In one embodiment, the condition detection circuit (60) includes a first detector input stage including a first detector input transistor (Q30) having a first terminal coupled to a first current source (I1), a control terminal coupled to a first input conductor (4), and a second terminal coupled to a first conductor (47), a second detector input transistor (Q17) having a second electrode coupled to a first terminal of a first detector diode (D6) having a second terminal coupled to the first current source (I1), a control electrode coupled to a second input conductor (3), and a first electrode coupled to a second conductor (48). A second detector input stage includes a third detector input transistor (Q31) having a second electrode coupled to a second current source (I2), a control electrode coupled to the second input conductor (3), and a first electrode coupled to the first conductor (47), a fourth detector input transistor (Q18) having a second electrode coupled to a first terminal of a second detector diode (D7) having a second terminal coupled to the second current source (I2), a control the electrode coupled to the first input conductor (4), and a first electrode coupled to the second conductor (48). A detector output stage includes a third current source (I3) coupled to the first conductor (47), a first detector resistor (R15) having a first terminal coupled to the second conductor (48) and a second terminal coupled to a reference voltage source (VB1), and a second detector resistor (R16) having a first terminal coupled to the first conductor (47) and a second terminal coupled to the reference voltage source (VB1), the first conductor (47) being coupled to the first portion (Q1,2,11,12) of the first stage (200A) and conducting a signal (VBmain) for indicating that the differential input signal (Vin) has a small-signal value, the second conductor (48) being coupled to the second portion of the first stage (200A) and conducting a signal (VBalt) for indicating that the differential input signal (Vin) has a large-signal value.

In one embodiment, the invention provides a method of providing a smooth transition between first (VBmain) and second (VBalt) control signals, by detecting a magnitude of a differential signal (ΔVin), and comparing the magnitude of the differential signal (ΔVin) to a predetermined threshold (VTH). If the magnitude of the differential signal ΔVin is less than the predetermined threshold (VTH), the method includes either (1) continuing to produce the first control signal value (VBmain) if the comparing indicates that there has been no change in the relationship between the magnitude of the differential signal (ΔVin) and the predetermined threshold (VTH), or (2) providing a gradual transition from producing the second control signal value (VBalt) to producing the first control signal value (VBmain) if the comparing indicates a change in the relationship between the magnitude of the differential signal (ΔVin) and the predetermined threshold (VTH). However, if the magnitude of the differential signal ΔVin is greater than the predetermined threshold (VTH) the method includes, either (1) continuing to produce the second control signal value (VBalt) if the comparing indicates that there has been no change in the relationship between the magnitude of the differential signal (ΔVin) and the predetermined threshold (VTH), or (2) providing a gradual transition from producing the first control signal value (VBmain) to producing the second control signal value (VBalt) if the comparing indicates a change in the relationship between the magnitude of the differential signal (ΔVin) and the predetermined threshold (VTH).

DETAILED DESCRIPTION OF THE PREFERRED EMBODIMENTS

The present invention provides a circuit and technique which can mitigate or even nearly eliminate inaccuracies in integrated circuit analog circuitry and "mixed signal" analog/digital circuitry that result from thermal imbalances caused by variations in digital and/or analog signals that are either applied to or generated within the integrated circuit.

Figure 3A:
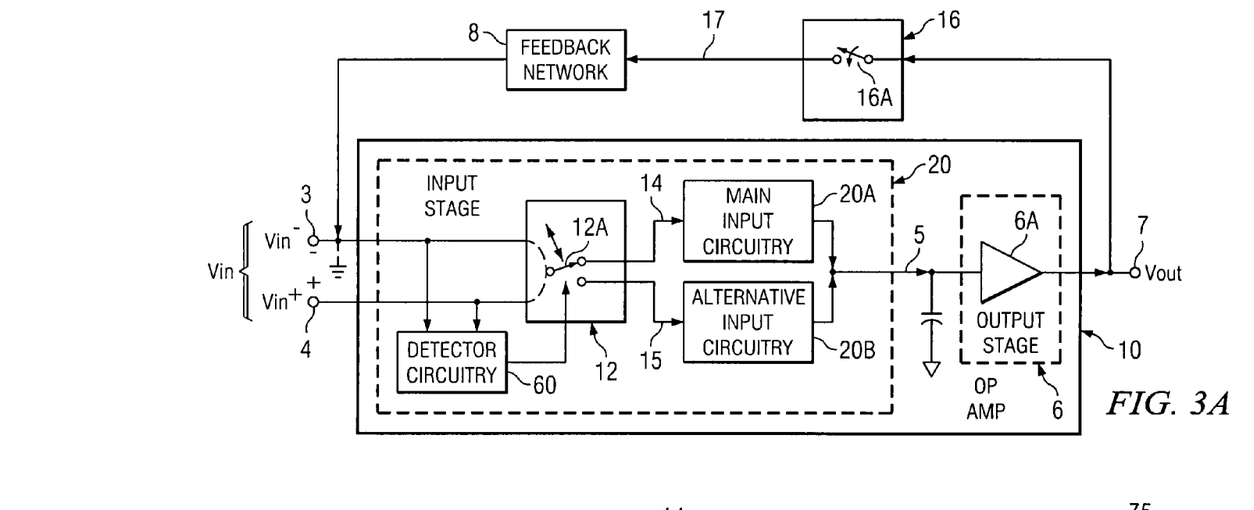
FIG. 3A is a block diagram of an analog circuit embodiment of the present invention.

FIG. 3A shows a block diagram of a feedback amplifier including an operational amplifier 10 which includes a switched input stage 20 according to the present invention, and also includes a conventional output stage 6. The input signal Vin=Vin+−Vin− is applied between input conductors 3 and 4 of switching circuitry that is "conceptually" illustrated in block 12. Switching circuitry 12, in effect, applies Vin either via a signal path 14 to the input of main input circuitry 20A or via an alternative signal path 15 to the input of alternative input circuitry 20B. Switching circuitry 12 also can be coupled to main circuitry and alternative circuitry in various other parts of operational amplifier 10, for example, in PNP cascode transistors Q5 and Q6 of input stage 20 in section 200B (subsequently described FIG. 4), output circuitry, and/or any other circuitry in which thermal imbalance due to variable signal conditions or other variable conditions can cause troublesome accuracy problems.

A switching circuit or element 12A in block 12 conceptually illustrates the switching of Vin through one or the other of main input circuitry 20A or alternative input circuitry 20B. The outputs of main input circuitry 20A and alternative input circuitry 20AB both are connected to comp node conductor 5, which is connected to the input of an output amplifier or buffer circuit 6A of output stage 6. Switching circuit/element 12A is controlled by a detector circuit 60, the inputs of which are connected to Vin. Detector circuit 60 detects whether Vin presently is at a normal or low-level signal value or is at an excessively high-level signal value which may cause troublesome thermal imbalances of the kind mentioned above. Output circuit 6A produces Vout on conductor 7, which is applied to an input of block 16.

Note that the total amount of power dissipation in input stage 20 is not changed when Vin is switched from main input circuitry 20A to alternative input circuitry 20B during large-signal operating conditions. Instead, the high amount of power dissipation and associated power imbalance caused by a large-signal value of Vin is shifted from main input circuitry 20A to alternative input circuitry 20B. Therefore, the main signal path of Vin through main input circuitry 20A for small-signal operation is unaffected by the thermal imbalances caused by large-signal values of Vin.

Block 16 in FIG. 3A conceptually represents a possible interruption in the feedback loop including feedback network 8. An example of such an interruption is disclosed in commonly assigned patent application Ser. No. 10/609,209 entitled "Output Stage, Amplifier and Associated Method for Limiting and Amplifier Output", filed Jun. 27, 2003, and incorporated herein by reference. The above-mentioned patent application describes the kind of interruption represented by block 16 in the feedback loop of FIG. 3A, which occurs as a result of switching between alternative output stages to suitably limit the range of the output signal. While the feedback loop is interrupted, the feedback to inverting input conductor 3 is meaningless. Although the circuitry described in the foregoing patent application has the thermal tail recovery problem previously described herein, it does not suggest any solution to that problem.

The output of block 16 is coupled by conductor 17 to the input of feedback network 8 (which often is simply a feedback resistor). The output of feedback network 8 is connected to inverting input conductor 3. Note that block 16 in FIG. 3 does not actually represent a physical switch circuit, and instead represents the existence of an interruption or discontinuity of the feedback loop through operational amplifier 10 and feedback network 8. When the feedback loop is closed, the amplifier shown in FIG. 3A has very high gain and therefore tries to force Vin to be equal to zero. But if the feedback loop is interrupted, then even a very minute value of Vin causes Vout to swing to either a maximum or minimum rail voltage, which, without the benefit of alternative input circuitry 20B and associated switching circuitry of the present invention, ordinarily would cause a thermal imbalance of the kind mentioned above, leading to a thermal recovery tail as shown by waveform "A" in FIG. 6.

Figure 4:
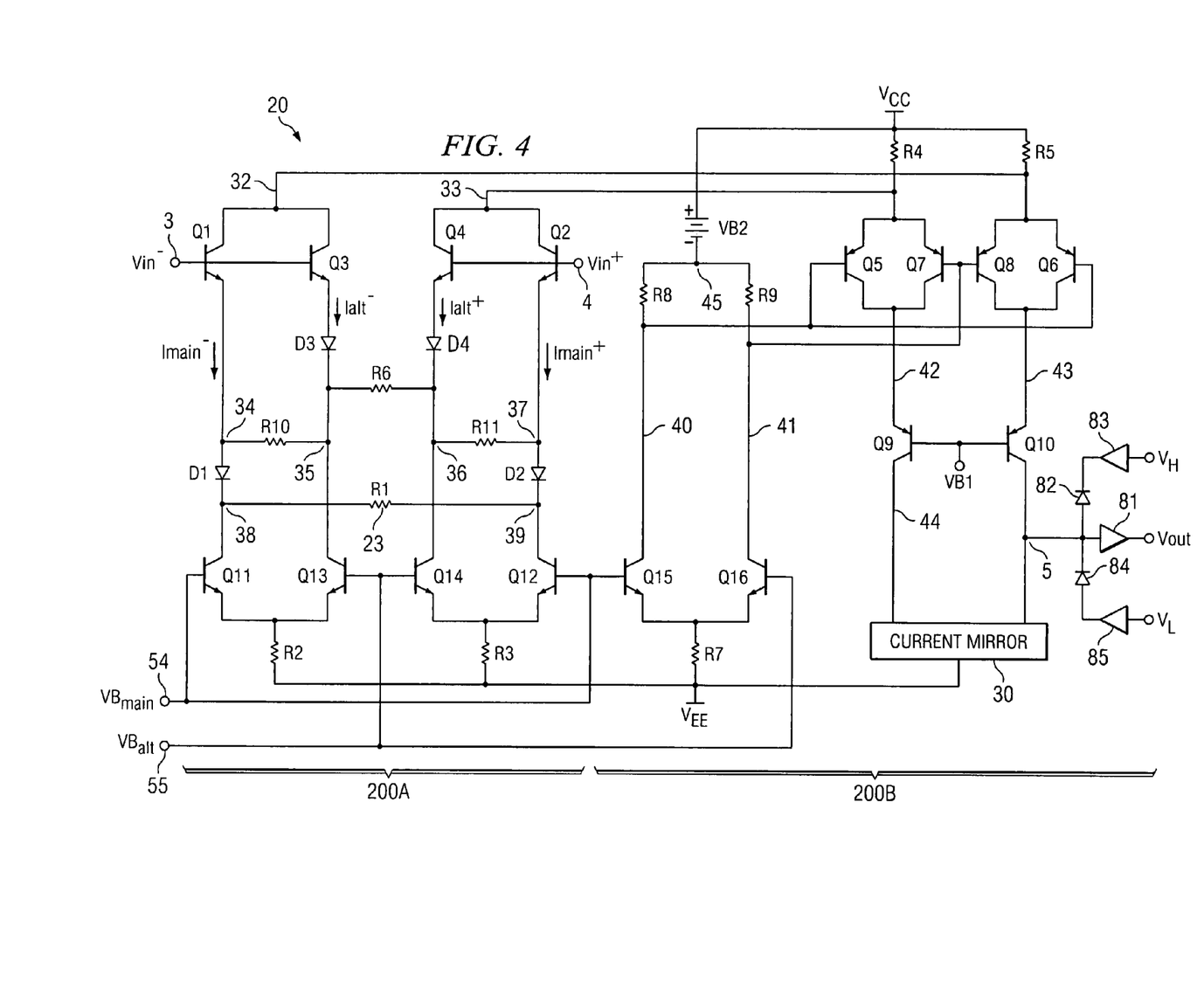
FIG. 4 is a basic schematic diagram of the input stage 20 of FIG. 3A including separate selectable stages in the input signal path for separately handling small-value and large-value signals in the input signal path.

FIG. 4 is a basic schematic diagram of the folded cascode input stage 20 of FIG. 3A, including the separate small-signal-handling main input circuitry 20A of FIG. 3A and large-signal-handling alternative input circuitry 20B of FIG. 3A. Referring to FIG. 4, folded cascode input stage 20 includes switched differential input circuitry 200A and switched folded cascode circuitry 200B. Switched differential input circuitry 200A includes NPN input transistors Q1, Q2, Q3 and Q4, diodes D1, D2, D3 and D4, and NPN switched current source transistors Q11, Q12, Q13, and Q14. Vin+ is connected to the bases of input transistors Q2 and Q4, and Vin− is connected to the bases of input transistors Q1 and Q3, Vin being equal to Vin+ minus Vin−. The collectors of input transistors Q1 and Q3 are connected by conductor 32 to one input of switched folded cascode circuitry 200B, and the collectors of input transistors Q2 and Q4 are connected by conductor 33 to another input of switched folded cascode circuit 200B.

The emitter of input transistor Q1 is connected by conductor 34 to the anode of a diode D1 and to one terminal of a resistor R10, the other terminal of which is connected to a conductor 35. The cathode of diode D1 is connected by a conductor 38 to the collector of NPN switched current source transistor Q11, the emitter of which is connected to one terminal of a resistor R2. The other terminal of resistor R2 is connected to VEE. Conductor 38 also is connected to one terminal of a resistor R1, the other terminal of which is connected to a conductor 39. Similarly, the emitter of transistor Q3 is connected to the anode of diode D3, the cathode of which is connected by conductor 35 to one terminal of a resistor R6, the other terminal of which is connected to a conductor 36. Conductor 35 is also connected to the collector of NPN switched current source transistor Q13, the emitter of which is connected to the emitter of switched current source transistor Q11.

The base of switched current source transistor Q11 is connected by conductor 54 to a bias control signal VBmain, and the base of switched current source transistor Q13 is connected by conductor 55 to a bias control signal VBalt. The emitter of input transistor Q2 is connected by a conductor 37 to one terminal of a resistor R11, the other terminal of which is connected to conductor 36. Conductor 37 also is connected to the anode of diode D2, the cathode of which is connected to conductor 39. Conductor 39 is connected to the collector of NPN switched current source transistor Q12, which has its base connected by conductor 54 to VBmain. The emitter of input transistor Q4 is connected to the anode of diode D4 which has its cathode connected by conductor 36 to the collector of NPN switched current source transistor Q14, which has its emitter connected to the emitter of switched current source transistor Q12 and to one terminal of a resistor R3 having its other terminal connected to VEE.

Thus, section 200A (FIG. 4) of input stage 20 amplifies differential input signal Vin by means of input transistors Q1 and Q2 of main input circuitry 20A (FIG. 3A) in response to VBmain during small-signal operating conditions, and amplifies differential input signal Vin by means of input transistors Q3 and Q4 of alternative input circuitry 20B (FIG. 3A) in response to VBalt during large-signal operating conditions. The large amount of power dissipated during large-signal operating conditions is thereby shifted from input transistor Q1 or Q2 of main input circuitry 20A (FIG. 3A) to either alternative input transistor Q3 or Q4 of alternative input circuitry 20B (FIG. 3A) during large-signal operating conditions, and therefore does not cause a thermal imbalance between main input transistors Q1 and Q2, and therefore does not generate a thermally induced offset between them.

Switched folded cascode circuitry 200B (FIG. 4) includes PNP switched folded cascode transistors Q5, Q6, Q7, and Q8, differentially coupled switching NPN transistors Q15 and Q16, and PNP cascode transistors Q9 and Q10. The base of switching transistor Q15 is connected to VBmain, and its emitter is connected to the emitter of an NPN transistor Q16 and to one terminal of a resistor R7 having its other terminal connected to VEE. The base of switching transistor Q16 is connected to VBalt. The collector of switching transistor Q15 is connected by a conductor 40 to one terminal of a load resistor R8 having its other terminal connected by conductor 45 to the (−) terminal of a voltage level shift circuit VB2, the (+) terminal of which is connected to VCC. Similarly, the collector of transistor Q16 is connected by a conductor 41 to one terminal of a load resistor R9, the other terminal of which is connected to conductor 45.

Conductor 40 also is connected to the bases of switched cascode transistors Q5 and Q6. Conductor 41 is connected to the bases of switched cascode transistors Q7 and Q8. The emitters of switched cascode transistors Q5 and Q7 are connected to conductor 33, which is connected to one terminal of a load resistor R4, the other terminal of which is connected to VCC. Similarly, the emitters of switched cascode transistors Q8 and Q6 are connected by conductor 32 to one terminal of a load resistor R5, the other terminal of which is connected to VCC. The collectors of switched cascode transistors Q5 and Q7 are connected by conductor 42 to the emitter of cascode transistor Q9, the collector of which is connected by conductor 44 to an input of a current mirror circuit 30. Similarly, the collectors of switched cascode transistors Q8 and Q6 are connected by conductor 43 to the emitter of cascode transistor Q10, the collector of which is connected by conductor 5 to Vcomp and to an output of current mirror circuit 30. The bases of cascode transistors Q9 and Q10 are connected to a bias voltage VB1.

If desired, a voltage swing limiting circuit can be connected to comp node conductor 5 as illustrated. The voltage swing limiting circuit can include a buffer amplifier 81, the output of which produces the output signal Vout. Comp node conductor 5 also is connected to the anode of a diode 82, the cathode of which is connected to the output of a buffer 83, the input of which is connected to a reference voltage VH. Similarly, comp node conductor 5 is connected to the cathode of a diode 84, the anode of which is connected to the output of a buffer 85, the input of which is connected to another reference voltage VL. This voltage swing limiting circuit or clamp amplifier produces a clipped output signal relative to the input signal. The resulting error signal, if this circuit were used in FIG. 3A, would have a distorted appearance that results from the clipped output signal, and there would be significant dwell time and therefore significant integrated power and consequently significant differential power dissipation between input transistors and/or cascode transistors.

Switched cascode transistors Q5 and Q6 in FIG. 4 are included in main input circuitry 20A of FIG. 3A, and are turned on in response to bias control signal VBmain during small-signal operating conditions. Switched cascode transistors Q7 and Q8 in FIG. 4 are included in alternative input circuitry 20B of FIG. 3A, and are turned on in response to bias control signal VBalt during large-signal operating conditions. Additional series cascode transistors (also referred to as re-cascode transistors) Q9 and Q10 in FIG. 4 function to reduce additional voltage offset that would be caused if the collector-emitter voltages of transistors Q5 and Q6 are not equal, which is what would occur during circuit operation if series cascode transistors Q9 and Q10 were to be omitted and instead conductors 42 and 43 were to be connected to conductor 44 and comp node conductor 5, respectively. This would occur irrespective of the switching of power from main input transistors Q5 and Q6 to alternative input transistors Q7 and Q8, because during circuit operation the voltage of conductor 44 is essentially constant (at the current mirror input voltage) while Vcomp on conductor 5 may have a wide range of values. Large values of Vcomp would cause a significant voltage offset between main cascode transistors Q5 and Q6 even if the Vin signal path has been switched to alternative cascode transistors Q7 and Q8 during large-signal operating conditions, unless series cascode (i.e., re-cascode transistors) transistors Q9 and Q10 are provided as shown.

Thus, section 200B of input stage 20 in FIG. 4 further amplifies differential input signal Vin by means of cascode transistors Q5 and Q6 of main input circuitry 20A in response to VBmain during small-signal operating conditions, and further amplifies differential input signal Vin by means of cascode transistors Q7 and Q8 of alternative input circuitry 20B in response to VBalt during large-signal operating conditions. The large amount of power dissipated during large-signal operating conditions is thereby shifted from cascode transistor Q5 or Q6 of main input circuitry 20A to either alternative cascode transistor Q7 or Q8 of alternative input circuitry 20B during large-signal operating conditions, and therefore does not cause a thermal imbalance between main cascode transistors Q5 and Q6, and therefore does not generate a thermally induced offset between them.

Note that transistors Q1, Q2, Q11, Q12, Q5, and Q6 in FIG. 4 are the same as in the conventional folded cascode circuit shown in FIG. 2A, and form main input circuitry 20A in FIG. 3A. During normal or small-signal mode of operation, the foregoing transistors perform the signal "differencing" and the "gain" functions of input stage 20. Transistors Q3, Q4, Q13, Q14, Q7, and Q8 form alternative input circuitry 20B of input stage 20 of FIG. 3A.

Note that the circuitry in FIG. 4 can be implemented without diodes D1-4. Resistors R1 and R6 are emitter degeneration resistors for differential transistor pairs Q1,2 and Q3,4, respectively, and typically have a resistance of approximately 300 ohms, so as to degenerate and linearize the amplification. Resistors R10 and R11 are very large-value resistors, typically 50 to 100 kilohms, and may be omitted because they mainly function to prevent conductors 34, 35, 36 and 37 from floating to indeterminate voltage levels and thereby result in smoother transitions between main circuitry 20A and alternative circuitry 20B.

The circuitry for switching power from a main signal path to an alternative signal path in accordance with the present invention can have gain designed so as to provide the needed level of "smoothness" in the transition between the two states. For example, if very low analog signal distortion is required, a very smooth transition associated with the two states is needed. However, for a comparator, a very sharp transition might be acceptable because the comparator output does not provide any additional information between a strong "1" signal and a strong "0" signal versus a "weak 1" and a "weak 0" signal. The comparator output values between transitions between a weak and a strong input signal ordinarily have no significance.

Achieving smooth switching transitions between main input circuitry 20A and alternative input circuitry 20B may be very important in a continuous signal path amplifier (where there is no interruption of the amplified signal or feedback path thereof), because, as indicated above, such smooth switching transitions reduce signal distortion. (However, in the case of a comparator in which the main input circuitry 20A and alternative input circuitry 20B are provided as shown in FIG. 3A, it would not be very important that the switching transition be smooth because in the comparator the only time the value of the signal is critical is during a small signal condition wherein the signal is being amplified by the main input circuitry 20A.) Thus, an advantage of the switched signal path embodiments of the present invention is that the transition between the alternative signal paths 20A and 20B can be very smooth if the particular application so requires.

Figure 9:
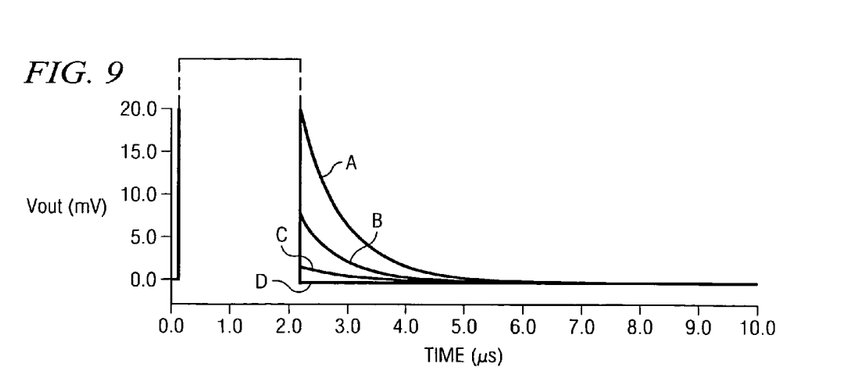
FIG. 9 is a graph illustrating contributions of various circuit design techniques in accordance with the present invention to output recovery time of the circuit shown in FIG. 4.

Computer simulations have shown that substantial contributors to thermal imbalance that lead to a long thermal recovery tail are offset voltages associated with input transistors Q1 and Q2 and cascode transistors Q5 and Q6. The computer simulations show that there are also thermally induced offset voltages associated with the current mirror 30 of FIG. 4. FIG. 9 illustrates the effects of various combinations of circuit techniques of several circuit design techniques in limiting recovery from thermal tails caused by the thermal imbalances previously described. Curve A shows the thermal tail recovery of Vout in FIG. 4 that would be obtained if the signal were not switched to the alternative signal paths and only a conventional folded cascode circuit were provided, without re-cascode transistors Q9 and Q10. Curve B shows the further improvement in the thermal tail recovery of Vout that would be achieved by only adding re-cascode transistors Q9 and Q10. Curve C shows the thermal tail recovery of Vout that would be achieved by providing the alternative signal path only in input stage 200A and also providing re-cascode transistors Q9 and Q10. Finally, curve D shows the thermal tail recovery of Vout that is achieved by using the alternative signal paths in both input stage 200A and cascode stage 200B and re-cascode transistors Q9 and Q10 as shown in FIG. 4.

There may be various practical methods for detecting the presence or absence of large-signal conditions in the circuit of FIG. 4 and accordingly for switching the amplifier signal path of Vin to one or the other of main input circuitry 20A and alternative input circuitry 20B. The switching is controlled by means of the two control bias signals VBmain and VBalt. During small-signal operation, VBmain is at a higher voltage, causing Vin to be amplified by main input circuitry 20A. However, during large-signal operation, VBalt is at a higher voltage than VBmain, which causes alternative input circuitry 20B to "take over" the amplification of Vin and causes main input stage 20A to shut down and therefore remain thermally balanced. Consequently, a much shorter thermal tail recovery time is required when Vin is switched back to the input of main input circuitry 20A.

Figure 3B:
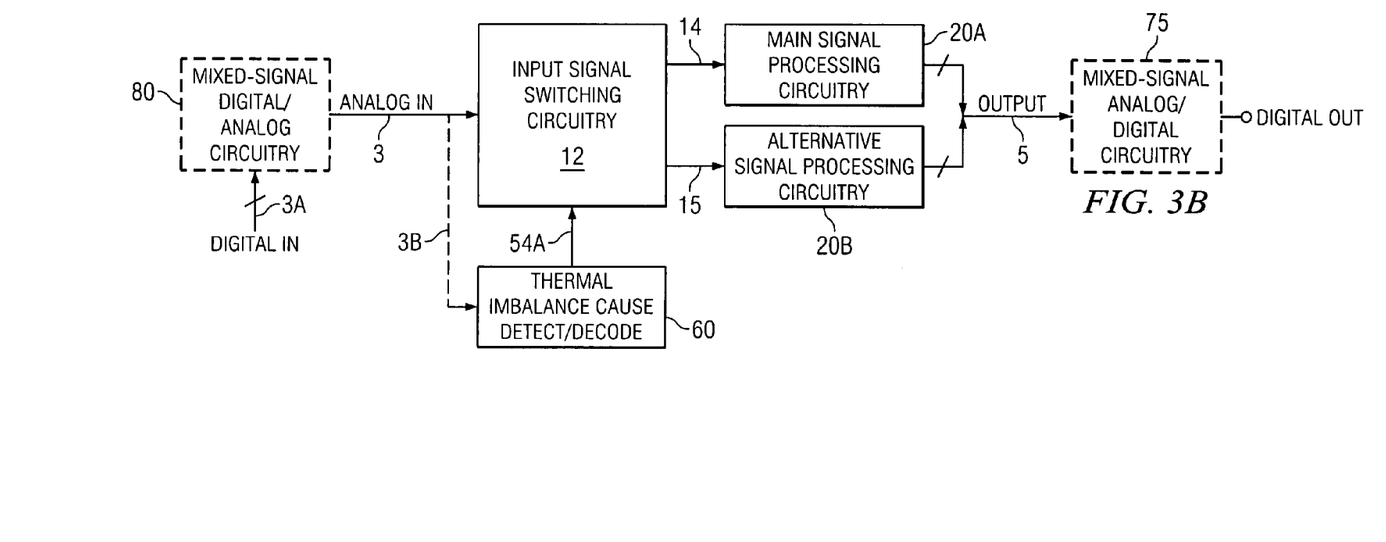
FIG. 3B is a block diagram of a mixed digital and analog circuit embodiment of the present invention.

FIG. 3B is a generalized diagram of an implementation of a switched-signal-path approach to reducing the above mentioned recovery times caused by thermal imbalance in an integrated circuit. In FIG. 3B, a mixed-signal digital/analog circuit as indicated by dashed-line block 80 may have an input 3A for receiving a digital input signal DIGITAL IN. mixed-signal digital/analog circuit 80 may perform any desired digital processing of DIGITAL IN and then convert it, with suitable amplification, to an analog signal ANALOG IN on conductor 3. ANALOG IN, which typically is a differential signal, is applied to an input of input signal switching circuitry 12. In response to an analog path selection signal (or signals) 54A, input signal switching circuitry 12 switches the signal ANALOG IN either to main signal processing circuitry 20A via signal path 14 or to alternative signal processing circuitry 20B via alternative signal path 15. As a practical matter, input signal path switching circuitry 12 can be combined with main signal processing circuitry 20A and alternative signal processing circuitry 20B in the manner illustrated in FIG. 4. Path selection signal 54A can be produced directly in response to the analog input signal ANALOG IN, which can be coupled as indicated by dashed line 3B to an input of thermal imbalance detect/decode circuit 60 if path selection signal 54A needs to be derived from ANALOG IN because the presence or absence of a thermal imbalance condition is directly caused by ANALOG IN. Alternatively, if the presence or absence of the thermal imbalance condition is determined by the presence or absence of a different circuit state or condition rather than by ANALOG IN, then path selection signal 54A can be produced in response to detection or decoding of that circuit state or condition by thermal imbalance detect/decode circuit 60.

The outputs of main signal processing circuitry 20A and alternative signal processing circuitry 20B are connected to output signal path 5 which conducts an analog output signal ANALOG OUT produced by either main signal processing circuitry 20A or alternative signal processing circuitry 20B. Output signal path may be connected to an input of a mixed-signal analog/digital circuit 75 which converts ANALOG OUT to a digital signal and performs any desired digital processing thereof to produce a digital output signal DIGITAL OUT on a digital output bus 5A.

The thermal imbalance which necessitates the above-mentioned thermal tail recovery times may be the direct result of a particular input signal, or it might occur as a result of a particular operating cycle or mode of the circuitry. Therefore, the circuitry in block 60 could be a digital implementation of the signal amplitude discrimination function if the signal exists in digital form at the stage at which detection is most conveniently made.

In amplifiers, the two alternative signal paths are likely to have similar response characteristics because a continuum of output response between small-signal-level input signals is usually expected. But in other kinds of circuits the circuitry of the alternate signal path might have a substantially different function then the circuitry of the main signal path. Although the previous description focuses mainly on the situation in which the main signal processing path and the alternative signal processing path have similar response characteristics, in some cases, the main and alternate signal paths might have different characteristics, for example, different gains. For example, in a comparator application the main or small-signal response path needs to have a high gain-bandwidth product, but may require oscillation control. In a large signal path it may be desirable to provide a different amount of gain-bandwidth or to provide hysteresis.

In a comparator is desirable to produce a digital output level as accurately and rapidly as possible in response to a very small-magnitude input signal, and the signal path characteristics during that time may be substantially different than the signal path characteristics during the rest of the time while the digital output level is merely being maintained. In some amplifier applications, the large-signal output characteristic of the amplifier might be clamped.

A good comparator usually is formed of multiple cascaded, relatively low gain stages in order to obtain the highest gain-bandwidth characteristic. Voltage offsets that occur in such second, third, fourth, etc. low gain stages will be significantly "reflected" back, i.e., "referred" back, to the input-referred offset voltages of the comparator. If it is a latching comparator, then use of a very narrow enable pulse is advisable, so the input stage is powered down after the output is latched, to reduce power dissipation and thermal mismatch problems. The circuitry including input stage 200A in FIG. 4 and load resistors R4 and R5 can function as an amplifying input stage of a comparator according to the present invention.

The input signal of a comparator is a differential input signal which is the difference between a "comparator input signal" and a "comparator reference signal", wherein the input stage of the comparator is a differential input stage. The switching circuitry Q11,Q12,Q13,Q14 in a comparator having input stage 200A of FIG. 4 as its input stage would operate in response to a condition detection circuit 60 which would be designed to recognize or decode the condition that the comparator would be in a highly imbalanced state most of the time and would select alternative input circuitry 20B most of the time so that the resulting thermal imbalance would be occurring in alternative input circuitry 20B, and during the same time the main input circuitry 20A would remain thermally balanced. The condition detection circuit 60 would switch the signal path to the thermally balanced main input circuitry 20A only for a short time interval to allow the comparator to make the next decision by determining whether the magnitude of the difference between the comparator input signal and the above-mentioned "comparator reference signal" exceeds a small predetermined value before the main input circuitry 20A could become thermally imbalanced, and then switch the signal path back to alternative input circuitry 20B.

The sample/hold circuit 70 shown in FIG. 2C can be improved in accordance with the present invention by using circuitry substantially similar to input stage 200A of FIG. 4 to implement the transconductance stage 71.

The basic signal-path-shifting technique of the invention works very well when applied to a comparator, because comparators have substantially the same thermally induced voltage offset problems as operational amplifiers if the signal on one input is not close to a threshold or window voltage applied to the other input, causing one side of the comparator input stage to conduct substantially more current and therefore be at a substantially higher temperature than the other side. In one embodiment of the invention, a comparator having the input signal path switched between main input circuitry and alternate input circuitry can be provided within an ADC to reduce/avoid problems caused by thermal hysteresis or other "thermal imbalance history" of the circuitry.

In general, the signal-path-shifting technique described herein can be used for any part of an integrated circuit wherein there is a thermal imbalance that causes an unacceptable deterioration of circuit performance.

Figure 5A:
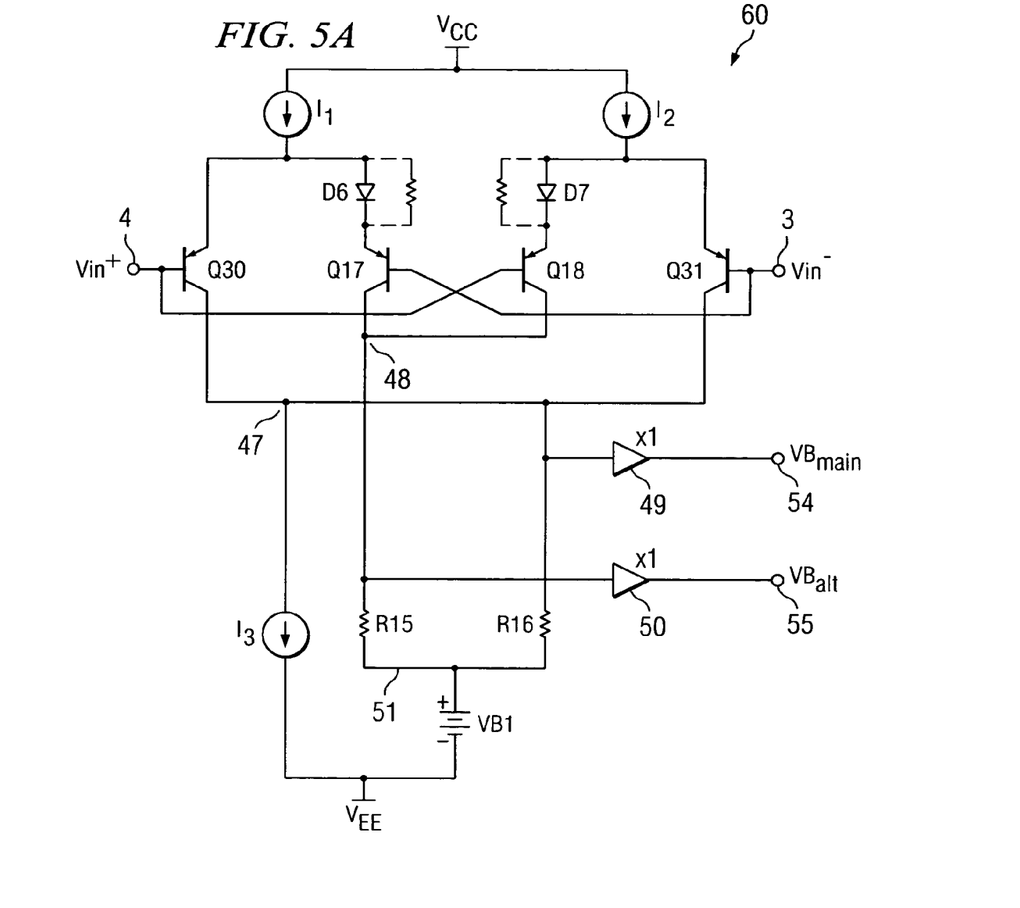
FIG. 5A is a schematic diagram illustrating a circuit for generating the switching control signals VBmain and VBalt in FIG. 4.

FIG. 5A shows a preferred embodiment of a circuit that can be used to generate bias control signals VBmain and VBalt directly from Vin. Referring to FIG. 5A, bias switching circuit 60 includes PNP input transistors Q30, Q31, Q17, and Q18 and diodes D6 and D7. Vin+ is connected by conductor 4 to the bases of transistors Q30 and Q18. Similarly, Vin– is connected by conductor 3 to the bases of transistors Q31 and Q17. The emitter of transistor Q30 is connected to a tail current source I1, which is also coupled to the anode of diode D6, the cathode of which is connected to the emitter of transistor Q17. The emitter of transistor Q31 is connected to another tail current source I2, which is also connected to the anode of diode D7, the cathode of which is connected to the emitter of transistor Q18. (Diodes D6 and D7 may be low-voltage Schottky diodes.) The collectors of transistors Q17 and Q18 are connected by conductor 48 to the input of a unity gain buffer 50 and to one terminal of a load resistor R15, the other terminal of which is connected to conductor 51. Similarly, the collectors of transistors Q30 and Q31 are connected by conductor 47 to the input of a unity gain buffer 49 and to one terminal of a resistor R16 having its other terminal connected to conductor 51. Conductor 51 is coupled to the (+) terminal of a level shift circuit VB1 having its (–) terminal connected to VEE. Conductor 47 also is connected to a bias current source I3.

Thus, the same input signal Vin which appears between the differential inputs of operational amplifier input stage 20 of FIG. 4 is also applied between the bases of transistors Q30,18 and the bases of transistors Q31,17 in bias switching circuit 60 of FIG. 5A, so that transistors Q30 and Q31 both are on during small-signal operation and conduct tail currents I1 and I2, respectively. Preferably, tail currents I1 and I2 and a bias current I3 each have a value Iswitch. Then, for small-signal operation, a current equal to 2*Iswitch from tail current sources I1 and I2 will be sourced into resistor R16, and a value Iswitch from bias current source I3 is subtracted from 2*Iswitch. The result is that resistor R16 will have a net current equal to Iswitch and the current in resistor R15 is zero. This causes VBmain to be at a higher level than VBalt because no current flows through resistor R15 and consequently no voltage is developed across it.

Either transistor Q17 or transistor Q18 will start conducting current when the value of the voltage Vin=Vin+–Vin– approaches the value of the turn-on voltage of diodes D6 and D7. This input voltage difference for switching threshold voltage, which roughly determines the onset of "large-signal" conditions, is somewhat arbitrary and could be set to various different values by minor circuit design modifications.

Under large-signal conditions, transistors Q17, Q18, Q30 and Q31 all are all on if either Vin+>>Vin– or if Vin+<<Vin–. That is, if a magnitude of Vin=(Vin– minus Vin+) exceeds a particular threshold voltage, the value of tail current source I1 or I2 is sourced and the value of bias current source I3 is subtracted from it, and resistor R15 receives a current of value Iswitch (from either tail current source I1 or I2) while resistor R16 receives a net current of 0. Therefore, during large-signal conditions VBalt is at a higher value than VBmain, and alternative input circuitry 20B (FIG. 3A takes over the amplification of Vin previously being performed by main input circuitry 20A, and main input circuitry 20A is shut down and therefore remains in a thermally balanced condition, so the thermal recovery tail will be short. Thus, the circuit of FIG. 5A performs either a strongly negative detection of Vin or a strongly positive detection of Vin. Diodes D6 and D7 determine how large the positive amplitude or negative amplitude of Vin needs to be for Vin to be considered to be in a "large signal" condition.

Figure 5B:
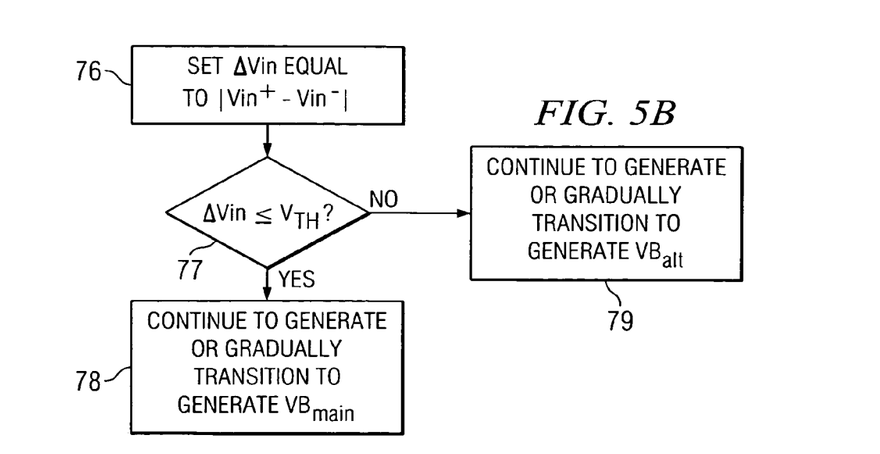
FIG. 5B is a generalized flow diagram of the operation of the circuit of FIG. 5A.

FIG. 5B can be interpreted as either a flow diagram of the basic operation of the circuit of FIG. 5A or as a generalized block diagram thereof. Block 76 represents input circuitry that performs the function of determining the magnitude of ΔVin=Vin+−Vin−. The signal produced in block 76 is utilized in block 77, in which a comparator can perform a decision to determine if the magnitude of Vin+−Vin− is less than or equal to an arbitrary threshold voltage VTH set by the circuit designer. If this is the case, the circuit either (1) continues to produce the same value of the signal VBmain to select the main input circuitry 20A as the signal path, as indicated in block 78 of FIG. 5B if the comparator decision indicates that there has been no change in a relationship between ΔVin and VTH, or (2) if the comparator decision represents a change in the relationship between ΔVin and VTH, the circuit undergoes a transition (which in some cases preferably is a relatively gradual, smooth transition) from generating VBalt to generating VBmain.

Similarly, as indicated in block 79, if the magnitude of ΔVin=Vin+−Vin− is greater than VTH, the circuit either (1) continues to produce the same value of the signal VBalt to select the alternative input circuitry 20B as the signal path if there has been no change in the relationship between ΔVin and VTH, or (2) if the comparator decision represents a change in the relationship between ΔVin and VTH, the circuit undergoes a transition, which in some cases preferably is a relatively gradual, smooth transition, from generating VBmain to generating VBalt.

The relatively gradual, smooth transitions referred to can be achieved by providing appropriate gain values and offsets in the signal paths by means of which the signals VBmain and VBalt, respectively, are generated. The gradual nature of the transition refers to the shape of the transfer function, not necessarily a temporal effect. That is, even if the transition of the signal is very slow, the switch-over should be gradual with respect to the signal changes.

The above described embodiment of the invention avoids the previously described thermal imbalance effects that otherwise would occur during low-level Vin conditions in main input circuitry 20A by switching the Vin signal path through alternative input stage 20B any time operating conditions would cause thermal imbalance in the main input circuitry 20A.

Figure 6:
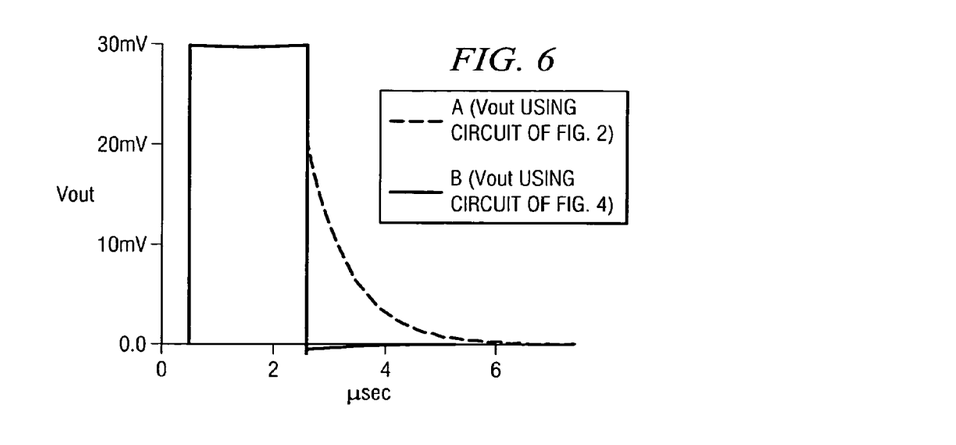
FIG. 6 is a diagram illustrating waveforms showing recovery of Vout for the prior art circuit of FIG. 2A and the circuit of the present invention as shown in FIG. 4.
Figure 7:
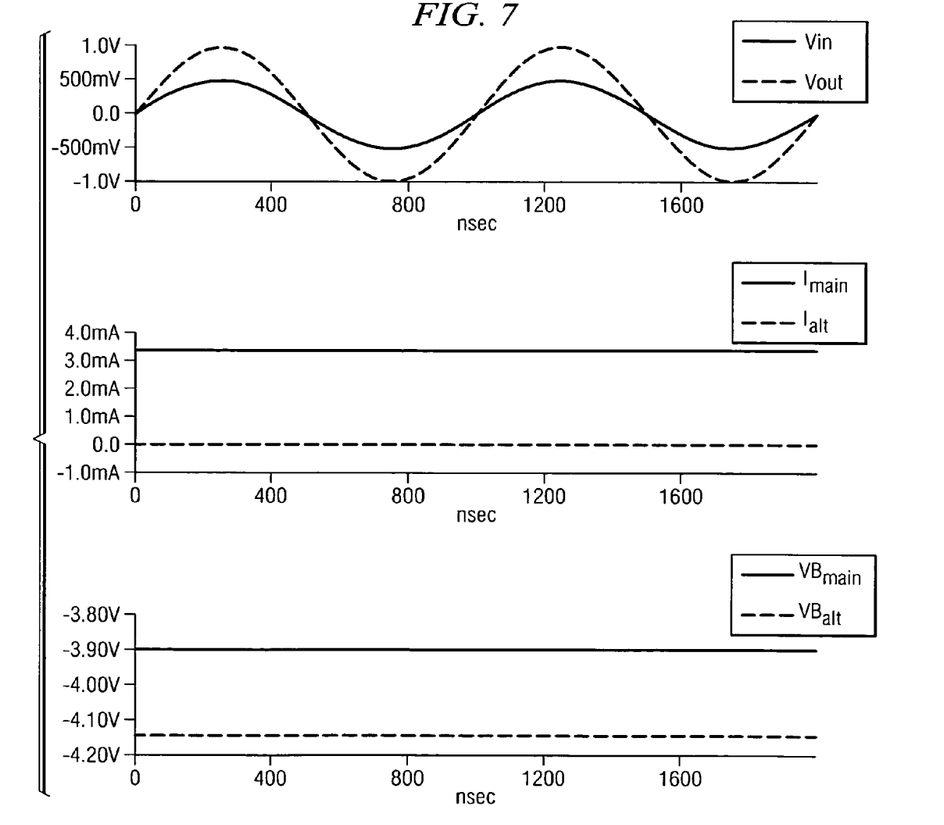
FIG. 7 is a diagram showing waveforms of Vin and Vout produced by the circuit of FIG. 5A for use in the circuit of FIG. 4 under small-signal conditions which do not cause switching of the folded cascode input stage.
Figure 8:
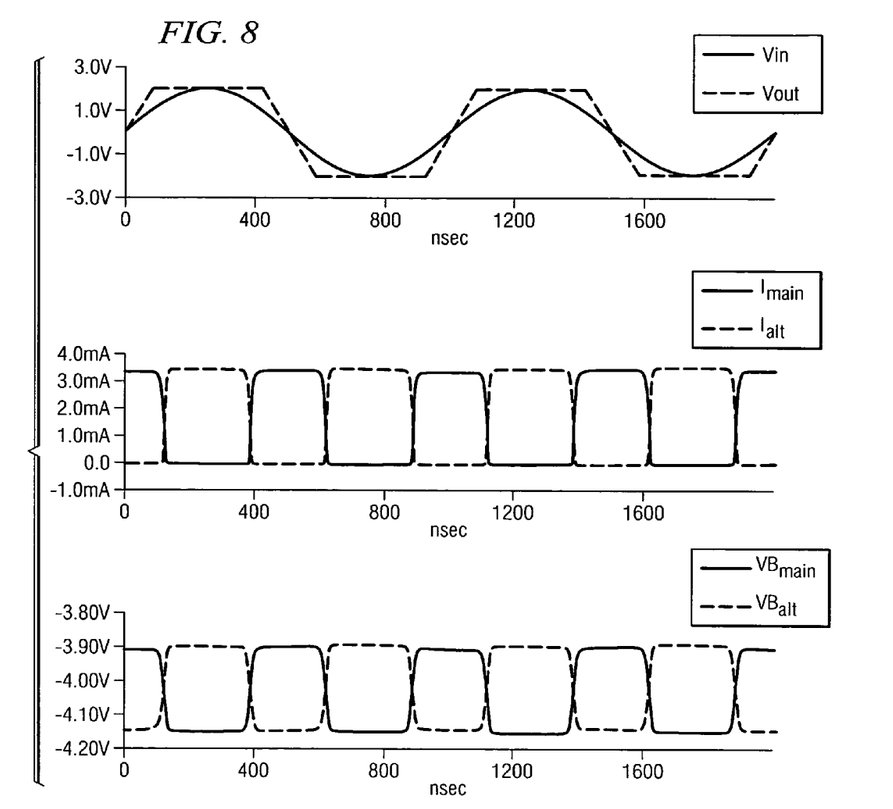
FIG. 8 is a diagram showing waveforms of Vin and Vout produced by the circuit of FIG. 5A for use in the circuit of FIG. 4 under large-signal conditions which cause switching of the folded cascode input stage.

Simulated waveform "B" in FIG. 6 shows substantially reduced improved time for thermal recovery of the disturbance of Vout of the circuit of FIG. 4 caused by a particular simulated large thermal imbalance, compared to the much longer corresponding thermal recovery time and much larger magnitude of disturbance for the prior art circuit of FIG. 2A. Also, the magnitude of the disturbance of Vout caused by the large thermal imbalance is much lower than that for the prior art circuit of FIG. 2A. FIG. 7 shows simulated waveforms of VBmain and VBalt for normal small-signal operation wherein no input stage switching occurs. FIG. 8 shows simulated waveforms for large-signal operation wherein input stage switching does occur.

An analysis has been performed to compare the harmonic distortion of the circuit of FIG. 4 associated with the circuit of prior art FIG. 2A with the harmonic distortion of switched differential input circuit of FIG. 4 including the switched folded cascode circuit 200B. The results of that analysis indicate that the difference in harmonic distortion between the prior art circuit of FIG. 2A, and also the circuits of FIGS. 3A and 4 is insignificant over the range of frequencies of interest. Specifically, in each case the harmonic distortion is below −65 dB in the range between 1 MHz and 7 MHz.

(Approximately page 40): Thus, the invention provides a solution to problems caused by thermal imbalances in analog circuitry, including such problems which occur in the context of analog circuitry included in a mixed signal processing circuit by providing a technique of switching or shifting power from a main signal path to an alternative signal path whenever necessary to prevent thermal imbalance of the main transistors, which causes inaccuracy of the output. The shifting of power from the main signal path to the alternative signal path can be provided in response to a control signal that is either directly produced in response to an input signal and causes the thermal imbalance, or in response to a control signal that is otherwise derived to precede the high-powered condition which otherwise would occur in the main signal path. Also, it should be appreciated that the invention is also applicable to relatively slow-recovering imbalances other than thermal imbalances, which slow-recovering imbalances are caused by circuit conditions, such as a large input signal imbalance. For example, in CMOS implementations, a prolonged, substantial-magnitude voltage imbalance between the gate voltages of a pair of differentially coupled input transistors can cause temporary charge migration in the gate oxide of one of the transistors relative to the charge distribution in the other input transistor, resulting in a corresponding temporary imbalance in the threshold voltages of the two input transistors. The basic technique of the present invention can mitigate or substantially eliminate the effects of the gate charge imbalance caused by such temporary gate charge migration.

By way of definition, the term "small-signal" is intended to refer to a signal wherein the signal amplitude is small enough to not cause an appreciable signal imbalance in the main signal path.

Also by way of definition, the term "differential" as used herein to describe, for example, a differential input stage or a differential signal, is not intended to be limited to the generally "symmetrical" circuit configurations illustrated herein. It is intended that the term "differential signal" encompass any signal that is referenced to another time-variable signal or to a fixed referenced signal such as ground (as indicated by the dashed line connected to Vin− shown in FIG. 3A), and that the term "differential" can be used to refer to any circuit providing a signal path for such a differential signal.

While the invention has been described with reference to several particular embodiments thereof, those skilled in the art will be able to make various modifications to the described embodiments of the invention without departing from its true spirit and scope. It is intended that all elements or steps which are insubstantially different from those recited in the claims but perform substantially the same functions, respectively, in substantially the same way to achieve the same result as what is claimed are within the scope of the invention. For example, the invention is generally equally applicable to both bipolar and MOS designs.

What is claimed is:

1. Signal processing circuitry comprising:
   (a) a first circuit stage for operating on signals in a signal path of an input signal;
   (b) the first circuit stage including main circuitry for operating on relatively small-value signals in the signal path of the input signal, the first circuit stage also including alternative circuitry for processing signals in the signal path of the input signal during a condition which otherwise would cause a relatively slow-recovering imbalance in the main circuitry; and (c) the first circuit stage including switching circuitry for coupling signals in the signal path of the input signal to the main circuitry during normal small-signal operating conditions and for coupling signals in the signal path of the input signal to the alternative circuitry during the condition which otherwise would cause relatively slow-recovering imbalance in the main circuitry.

2. The signal processing circuitry of claim 1 wherein the relatively slow-recovering imbalance is a thermal imbalance.

3. The signal processing circuitry of claim 2 wherein the switching circuitry operates in response to a condition detection circuit for detecting the presence of the condition.

4. The signal processing circuitry of claim 3 wherein the condition detection circuit operates in response to the input signal to detect the condition by detecting whether a magnitude of the input signal exceeds a predetermined value.

5. The signal processing circuitry of claim 3 wherein the condition detection circuit operates to detect the condition by recognizing a predetermined state of a system coupled to the signal processing circuitry.

6. The signal processing circuitry of claim 2 wherein the first circuit stage is an input stage of an operational amplifier.

7. The signal processing circuitry of claim 2 wherein the first stage is a folded cascode stage of an operational amplifier.

8. The signal processing circuitry of claim 4 further including a folded cascode stage which includes
(1) main circuitry coupled to an output port of the input stage for operating on the relatively small-value signals in the signal path of the input signal, the folded cascode stage also including alternative circuitry coupled to the output port for amplifying the signals in the signal path of the input signal during a condition which otherwise would cause thermal imbalance in the main circuitry of the folded cascode stage, and
(2) switching circuitry for coupling the signals in the signal path of the input signal to the main circuitry of the folded cascode stage during the normal small-signal operating conditions and for coupling signals in the signal path of the input signal to the alternative circuitry of the folded cascode stage during the condition which otherwise would cause thermal imbalance in the main circuitry of the folded cascode stage.

9. The signal processing circuitry of claim 2 wherein the first circuit stage is an input stage of a comparator.

10. The signal processing circuitry of claim 2 wherein the first circuit stage is an input stage of a sample/hold circuit.

11. The signal processing circuitry of claim 9 wherein the input signal is a differential input signal which is a difference between a comparator input signal and a comparator reference signal, wherein the input stage of the comparator is a differential input stage, and wherein the switching circuitry operates in response to a condition detection circuit which determines a short time interval during which a comparator decision is to be made and couples signals in the signal path of the input signal to the main input circuitry during the short time interval.

12. The signal processing circuitry of claim 5 wherein the system coupled to the signal processing circuitry includes mixed-signal circuitry including analog circuits and digital circuits which operate to produce the input signal.

13. The signal processing circuitry of claim 12 wherein the mixed-signal circuitry operates in response to a digital input signal.

14. The signal processing circuitry of claim 12 including mixed-signal circuitry coupled to receive an analog signal produced in response to the first circuit stage and operative in response to the analog signal to produce a digital output signal.

15. The signal processing circuitry of claim 1 wherein the alternative circuitry has a transfer characteristic that is substantially similar to a transfer characteristic of the main circuitry.

16. The signal processing circuitry of claim 3 wherein the condition detection circuit operates to decouple the input signal from a first one of the main input circuitry and the alternative input circuitry while simultaneously operating to couple the input signal to the other of the main input circuitry and the alternative input circuitry.

17. The signal processing circuitry of claim 2 wherein the first circuit stage is an input stage that includes a switched differential amplifier section including first, second, third and fourth input transistors, and first, second, third and fourth switching transistors, first electrodes of the first and third input transistors being coupled by a first conductor to a first terminal of a first load device, first electrodes of the second and fourth being coupled by a second conductor to a first terminal of a second load device, control electrodes of the first and third input transistors being coupled to a first input signal, control electrodes of the second and fourth input transistors being coupled to a second input signal, an second electrode of the first input transistor being coupled to a first electrode of the first switching transistor, an second electrode of the second input transistor being coupled to a first electrode of the second switching transistor, an second electrode of the third input transistor being coupled to a first electrode of the third switching transistor, an second electrode of the fourth input transistor being coupled to a first electrode of the fourth switching transistor, second electrodes of the first and third switching transistors being coupled to a first terminal of a first current source, and second electrodes of the second and fourth switching transistors being coupled to a first terminal of a second current source, control electrodes of the first, second, third and fourth switching transistors being coupled to a condition detection circuit for detecting the condition.

18. The signal processing circuitry of claim 17 wherein the condition detection circuit includes a first detector input stage including a first detector input transistor having a first electrode coupled to a first current source, a control electrode coupled to the second input signal, and a second electrode coupled to a first conductor, a second detector input transistor having a first electrode coupled to a first electrode of a first detector diode having a second electrode coupled to the first current source, the second detector input transistor having a control electrode coupled to the first input signal, and a first electrode coupled to a second conductor;

a second detector input stage including a third detector input transistor having a first electrode coupled to a second current source, a control electrode coupled to the first input signal, and a second electrode coupled to the first conductor, a fourth detector input transistor having a first electrode coupled to a first electrode of a second detector diode having a second electrode coupled to the second current source, a control the electrode coupled to the second input signal, and a second electrode coupled to the second conductor; and a detector output stage including a third current source coupled to the first conductor, a first detector resistor having a first terminal coupled to the second conductor and a second terminal coupled to a reference voltage source, and a second detector resistor having a first terminal coupled to the first conductor and a second terminal coupled to the reference voltage source, the first conductor being coupled to the control electrodes of the first and second switching transistors of the switched differential amplifier section of the first stage and conducting a signal for indicating that the differential input signal has a small-signal value, the second conductor being coupled to the control electrodes of the third and fourth switching transistors of the switched differential amplifier section of the first stage and conducting a signal for indicating that the differential input signal has a large-signal value.

19. A method of reducing thermal imbalance in a signal processing circuit including a differential amplifier having an input stage for amplifying a signal in a path of a differential input signal, and an output stage coupled to the input stage for producing an output signal, the method comprising:
   (a) providing main input circuitry in the input stage for amplifying small-signal values of the input signal and also providing alternative input circuitry in the input stage for amplifying the input signal during a condition which otherwise would cause thermal imbalance in the main input circuitry;
   (b) detecting whether the condition is present;
   (c) coupling the input signal to the main input circuitry while the condition is not present; and
   (d) coupling the input signal to the alternative input circuitry while the condition is present.

20. A method of providing a smooth transition between first and second control signal values, comprising:
   (a) detecting a magnitude of a differential signal;
   (b) comparing the magnitude of the differential signal to a predetermined threshold;
   (c) if the magnitude of the differential signal is less than the predetermined threshold, either
      i. continuing to produce the first control signal value if the comparing indicates that there has been no change in the relationship between the magnitude of the differential signal and the predetermined threshold, or
      ii. providing a gradual transition from producing the second control signal value to producing the first control signal value if the comparing indicates a change in the relationship between the magnitude of the differential signal and the predetermined threshold; and
   (d) if the magnitude of the differential signal is greater than the predetermined threshold, either
      i. continuing to produce the second control signal value if the comparing indicates that there has been no change in the relationship between the magnitude of the differential signal and the predetermined threshold, or
      i. providing a gradual transition from producing the first control signal value to producing the second control signal value if the comparing indicates a change in the relationship between the magnitude of the differential signal and the predetermined threshold.

* * * * *